United States Patent [19]
Sasaki et al.

[11] Patent Number: 5,469,390
[45] Date of Patent: Nov. 21, 1995

[54] SEMICONDUCTOR MEMORY SYSTEM WITH THE FUNCTION OF THE REPLACEMENT TO THE OTHER CHIPS

[75] Inventors: Toshio Sasaki, Tokyo; Toshihiro Tanaka, Akigawa, both of Japan

[73] Assignee: Hitachi, Ltd., Tokyo, Japan

[21] Appl. No.: 301,284

[22] Filed: Sep. 6, 1994

[30] Foreign Application Priority Data

Sep. 16, 1993 [JP] Japan .................................. 5-229865

[51] Int. Cl.$^6$ .............................. G11C 7/00; G11C 29/00
[52] U.S. Cl. .................... 365/200; 365/201; 365/230.03; 371/10.2
[58] Field of Search .............................. 365/200, 230.03, 365/201; 371/10.1, 10.2, 10.3

[56] References Cited

U.S. PATENT DOCUMENTS

| | | | |
|---|---|---|---|
| 5,293,348 | 3/1994 | Abe | 365/200 X |
| 5,315,552 | 5/1994 | Yoneda | 365/200 |
| 5,357,473 | 10/1994 | Mizuno | 365/201 |

FOREIGN PATENT DOCUMENTS 1269299 10/1989 Japan .

Primary Examiner—David C. Nelms
Assistant Examiner—Son Mai
Attorney, Agent, or Firm—Kenyon & Kenyon

[57] ABSTRACT

In a semiconductor memory system including a plurality of memory chips, a spare memory is shared among the memory chips. For such a purpose, a common redundant circuit and an external terminal capable of accessing to a spare memory are added to a semiconductor memory system, and a first region for storing a defect address in each memory of the semiconductor memory system and a second region for storing a defect address of the system of the object having the same structure as the first region are provided in the redundant circuit. With this, even when the defect of a normal memory of the semiconductor memory system can not be replaced with the spare memory of the system itself, replacement is made possible with other system having the same structure. Accordingly, the yield of the semiconductor memory system can be increased, and the reliability is also increased.

30 Claims, 8 Drawing Sheets

SEMICONDUCTOR MEMORY SYSTEM WITH THE FUNCTION OF THE REPLACEMENT TO THE OTHER CHIPS

BACKGROUND OF THE INVENTION

1. Field of the Invention

The present invention relates to a redundant scheme for a semiconductor memory system, and more particularly to a semiconductor memory system suitable for a memory system such as an audio system, a visual system and a computer using a plurality of chips.

2. Description of the Related Art

First, a semiconductor memory system according to a conventional technique will be described in order to facilitate comprehension of a basic function of the present invention. A conventional semiconductor memory system as set forth in Japanese Patent Document No. JP-A-1-269299, shown in FIG. 2, includes a redundant circuit.

Namely, the memory system includes, in addition to a normal memory, a spare memory chip and a control circuit for transferring an address signal and an I/O signal, transferred to a position of the defect of the normal memory, to a spare memory. With this technique, it is even possible to use a memory chip including a defect bit as a component of a memory module.

SUMMARY OF THE INVENTION

The area of a memory board, a memory module, a memory card or the like is generally small. Therefore, the semiconductor memory system set forth in Japanese Patent Document No. JP-A-1-269299, which includes a spare memory chip and a control circuit added for the purpose of replacement of a defect bit, has a smaller number of mountable memory chips as compared with those that have no spare memory. Further, since the number of added components is larger than that of semiconductor memory systems having no spare memory chip, the manufacturing cost thereof is high.

On the other hand, in order to improve the yield of conventional single semiconductor memory chips, redundant circuits called on-chip redundant circuits, have been provided in chips. However, the effect of replacement by on-chip redundant circuit tends to fall as integration and capacity of the semiconductor memories are made higher and larger. Further, when the number of redundant lines is increased, the scale of the redundant circuit, which includes a spare memory and a spare decoder, becomes larger. Hence, the chip area is increased. The yield of semiconductor memory systems depends on chip area, defect density or the like. Therefore, when the number of redundant lines is increased to the number of redundant lines that the highest yield is obtainable or more, the yield shows a tendency to be reduced.

The present invention relates to a semiconductor memory system of high yield while preventing increase of the occupied area of a redundant circuit and increase of fitting troubles that become an issue in the conventional technique described above.

According to one embodiment (FIG. 1) of the present invention, the above-mentioned object is achieved as described hereunder.

One embodiment (FIG. 1) of the present invention shows a semiconductor memory system 2 comprising:

a normal memory block 36;

a spare memory block 37;

a program/comparison part 16 composed of a defect address program part and a coincidence detector part for comparing the defect address programmed in the program/comparison part with an external address; and a redundancy select circuit 31 for determining which of either an internal spare memory 37 of a first semiconductor memory or a spare memory 37 of an external (i.e., on the other object side) second semiconductor memory forming a semiconductor memory system 2 replaces the defect bit of the normal memory block 36 of the first semiconductor memory forming this semiconductor memory system 2;

wherein the program/comparison part 16 comprises:

a flag bit 82a for determining whether an internal spare memory, (i.e., a spare memory of the first semiconductor memory) is to be used or not; and a flag bit 82b for activating by sharing the spare memory of the object of replacement, namely, the second semiconductor memory.

The embodiment (FIG. 1) of the present invention further shows that an output 82 of the flag bit 82b of the first semiconductor memory is inputted to the redundancy select circuits 31 and outputted from an external terminal 18, and furthermore, the external terminal 18 is connected to an external terminal 18 of the second semiconductor memory 2.

On the other hand, another embodiment (FIG. 10) of the present invention shows a structure in which an object chip activating signal 23' generated by an external chip select signal 23 is outputted at an external terminal 18' of the first semiconductor memory connected in common to the second semiconductor memory 2" that is the object of replacement, and in that case, the normal memory block and the spare memory block of the first semiconductor memory are activated and the spare memory of the second semiconductor memory is also activated.

In a semiconductor memory system of the present invention, taking a case that the unit is incorporated into the system for use into consideration, the normal memory and the spare memory are divided into several groups and the minimum required groups are made active when the memory unit is operated, thereby to realize low power consuming performance.

Besides, an open terminal or a terminal that is not used normally of an IC package is used as the external terminal. Further, a terminal of a special IC package for a memory system where replacement to the other chips is taken into consideration may also be used. Further, this terminal may be a replacement pad or a terminal that is used at time of pasting a base chip and is not connected to a pin of formal external specification. Furthermore, a terminal used for another purpose and the external terminal may be made in common. For example, the input and the output may be made to show a level different from an ordinary case. On the other hand, a memory that is not used for replacement to the other chips may also be arranged so that the external terminal thereof is connected to Vcc or Vss and does not appear outside the package.

Thus, it is possible to improve the yield of the semiconductor memory system while controlling the package area to a minimum by incorporating the redundant circuit means of the present invention into the semiconductor memory system.

According to a preferred embodiment (FIG. 1) of the present invention, even if all of the spare memory spaces are used by A, B, C and D as shown in FIG. 3, defect address Q and R which can not be replaced by the first semiconductor memory, are replaced by another semiconductor memory 2. Hence, it is possible to make the whole system a non-defective unit. This means that defective memories can be replaced when the total quantity of defects of the normal memory block of all the semiconductor memory systems is the same as or less than the total quantity of normal spare lines of all the spare memory blocks.

On the other hand, in another embodiment (FIG. 10) of the present invention, activation of the first semiconductor memory and activation of the spare memory block of the second semiconductor memory are made at almost the same time. Therefore, the spare memory of the second semiconductor memory is able to respond at a high rate to the access from the outside.

Furthermore, according to the embodiment shown in FIG. 1, the flag bits 82a and 82b activate any one of the normal memory block or the spare memory block of the first semiconductor memory, or the spare memory block of the second semiconductor memory. With this, the current consumption of the system can be reduced. Further, according to the embodiment shown in FIG. 10, a chip select signal of the first semiconductor memory and an object chip activating signal of the second semiconductor memory are activated for a certain period of time, thereafter, the flag bits 82a and 82b activate any one of the normal memory block or the spare memory block of the first semiconductor memory, or the spare memory block of the second semiconductor memory selectively. In this case, the current consumption of the memory system is also reduced in a similar manner.

Other objects and unique characteristics of the present invention will be made apparent from the embodiments described in detail hereinafter.

DETAILED DESCRIPTION

Embodiments of the present invention will be described in detail hereinafter with reference to the drawings.

Figure 1:
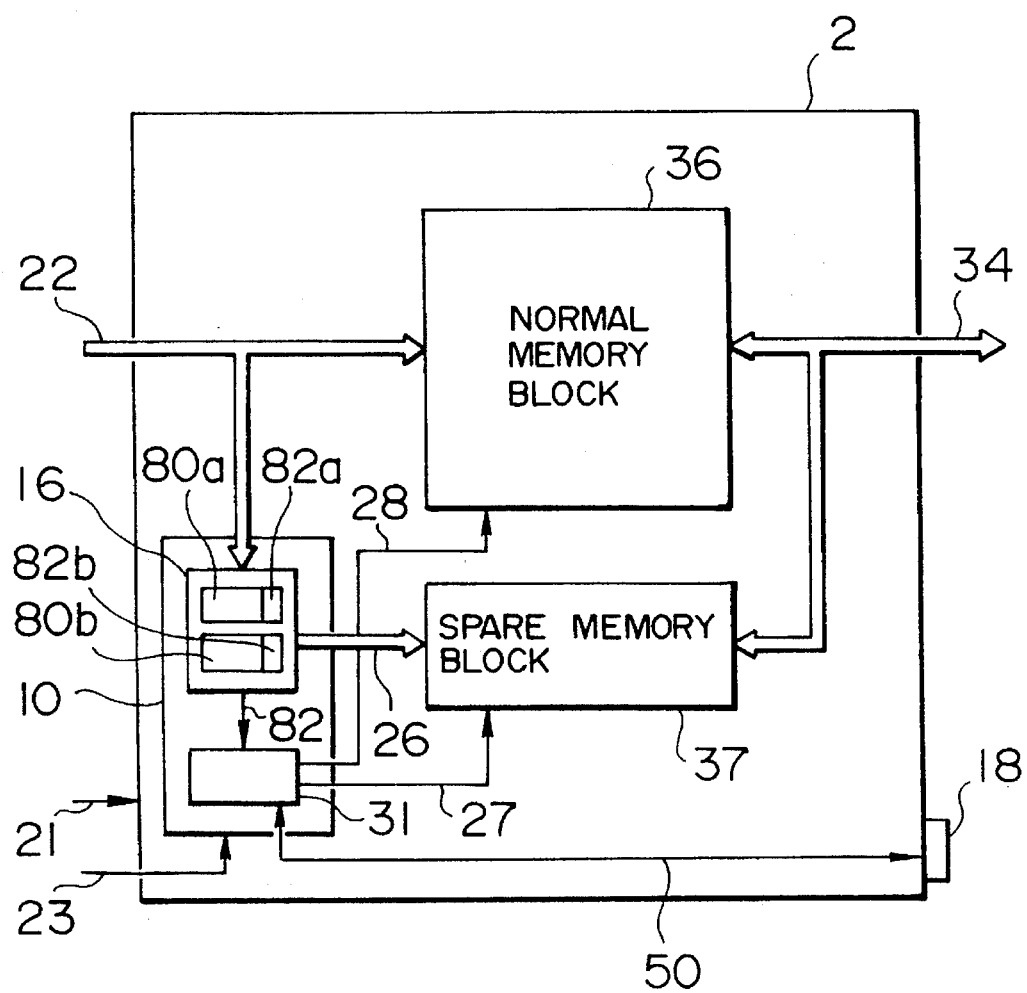
FIG. 1 is a block diagram showing a semiconductor memory system according to a first embodiment of the present invention.
Figure 2:
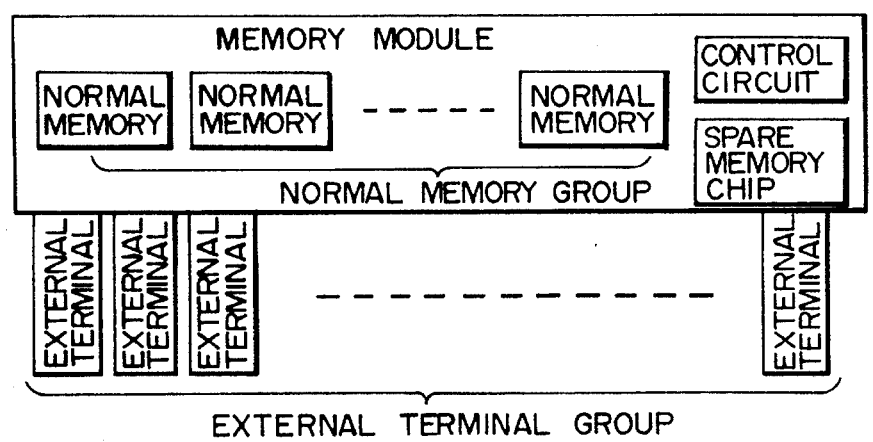
FIG. 2 is a block diagram for explaining a memory system using a semiconductor memory system of a prior art.

FIG. 1 is a block diagram showing a semiconductor memory system of the present invention.

In FIG. 1, a reference numeral 2 represents a semiconductor memory for storing information, 36 represents a normal memory block composed of a plurality of memory cells and including a normal decoder for selecting a memory cell, 37 represents a spare memory block, which is composed of a plurality of memory cells and includes a spare decoder is used as a spare memory of the normal memory, 16 represents program/comparison part for storing defect addresses and detecting coincidence with external addresses in order to select a spare line of the spare memory block 37, 31 represents a redundancy select circuit for controlling activation of the normal memory block 36 and the spare memory block 37 and selecting and determining whether it is the internal spare memory of the semiconductor memory 2 or the external spare memory thereof, and 10 represents a common redundant circuit composed of the program/comparison part 16 and the redundancy select circuit 31. Furthermore, 26 represents a spare memory select signal, which is outputted from the program/comparison part 16.

When it is assumed that the semiconductor memory system of its own is a first semiconductor memory, 80a shows a defect address value of its own programmed externally for generating a spare memory select signal 26 of the first semiconductor memory.

Further, 80b shows a defect address value of an object programmed externally for generating and activating the spare memory select signal 26 of a second semiconductor memory that becomes the object of replacement of the first semiconductor memory.

On the other hand, 82a represents a flag bit for activating by sharing the spare memory of the first semiconductor memory, and 82b represents a flag bit for activating by sharing the spare memory of the second semiconductor memory that becomes the object of replacement of the first semiconductor memory. Furthermore, 21 represents a memory control signal for controlling write/read and controlling input/output of data or the like, 23 a chip select signal, 50 a common internal spare line composed of at least one line, 18 an external terminal or a bonding pad of a chip, 22 an external address, 28 a normal memory activating line for activating a normal memory block 36 based on flag bits 82a and 82b, 27 a spare memory activating line for activating a spare memory block 37 similarly to the above, 82 an output line of the flag bit 82b and 34 an external I/O line, respectively.

Here, the common redundant circuit 10 is operated by a circuit or an active line described hereunder. The common redundant circuit 10 is controlled so as to output a select signal 26 of the spare line and signals to respective activating lines 28 and 27 of the normal memory block 36 and the spare memory block 37 and to deactivate the normal memory block 36 when the spare memory block 37 is activated. On the other hand, the program/comparison part 16 is added with flag bits 82a and 82b formed of at least one bit, respectively, in addition to the defect address values 80a and 80b.

Figure 3:
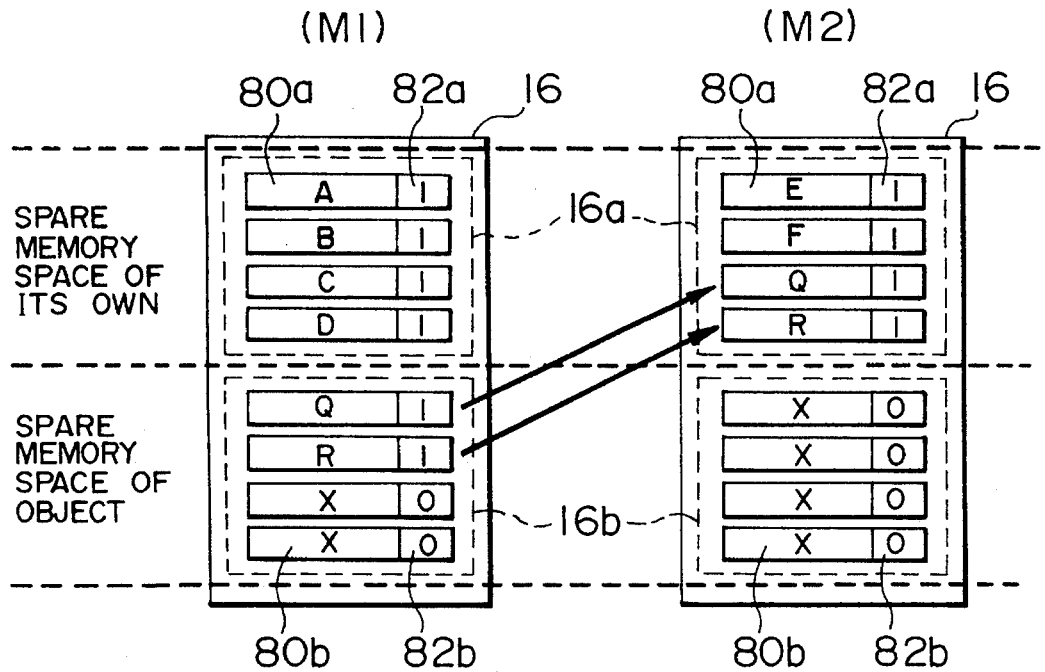
FIG. 3 shows an example of defect addresses and flag bits for explaining FIG. 1.

FIG. 3 shows an example of defect addresses and flags. Those parts that are the same as those in FIG. 1 are assigned with same reference numerals, and reference numerals of different parts will be described. In the present embodiment, it is assumed that M1 represents the first semiconductor memory and M2 represents similarly the second semiconductor memory for convenience' sake of explaining the operation. Further, 16a represents spare memory spaces of the first semiconductor memory M1 of its own in M1 and M2 and consists of regions for storing principally the defect address values and the flag bits of its own, and 16b represents spare memory spaces of the second semiconductor memory M2 of the object in M1 and M2 and consists of regions for storing principally the defect address values and the flag bits of the object. On the other hand, A to F represent defect address values shown with binary values "0" and "1", and X represents don't-care and may be either "0" or "1". These flag bits 82a and 82b may be either generated based on the result of coincidence detection between the external address and the programmed defect address or programmed in advance when the defect address is stored so that the contents of the flag are outputted based on the result of coincidence detection. Besides, the flag bit 82b may also be structured so that the result of coincidence detection performed in the region of the spare memory space 16b of the object of M1 is used when the flag is one bit.

Next, the operation of the present embodiment will be described briefly with reference to FIG. 1 and FIG. 3. First, it is assumed that the relationship between the defect address value and the flag bit in the program/comparison part 16 is, for example, as shown in FIG. 3, A to D show "1" in the spare memory space 16a of its own of the first semiconductor memory M1, Q and R are both "1", and "0" for the don't-care value X in the spare memory space 16b of the second semiconductor memory M2 in the first semiconductor memory M1. "1" of 82a of the former A to D shows a flag for replacing a defect bit of the normal memory of the first semiconductor memory M1 with the spare memory of the first semiconductor memory M1 (self replacement), and "1" of 82b of the latter Q and R shows a flag for replacing the defect bit of the normal memory of M1 with the spare memory of M2 looking from M2 (object replacement). Furthermore, "0" of 82a and 82b shows that replacement operation is not activated in the spare memory space of M1 or M2. Namely, when the flag 82a of the spare memory space 16a of the self memory of the first semiconductor memory M1 shows "1", the external terminal 18 of M1 is in a deactivated state and the spare memory of M1 is activated selectively. Further, when the flag 82b of the spare memory space 16b of the second semiconductor memory M2 in the first semiconductor memory M1 shows "1", the external terminal 18 is brought into an activated state at a high level, and the spare memory of the second semiconductor memory M2 is activated selectively. Furthermore, when the external terminal 18 is at a high level, the normal memory block 36 and the spare memory block 37 of the first semiconductor memory M1 are deactivated, and further the external terminal 18 of the second semiconductor memory M2 is brought to a high level. Hence, the circuit related to the spare memory of M2 is activated selectively. Besides, the operation is performed so that the normal memory block 36 is selected when the flag 82a of the spare memory space of the first semiconductor memory M1 shows "0". These flag bits 82a and 82b are utilized also as power saving of the first semiconductor memory M1 or the second semiconductor memory M2.

With such a structure, the defect address values E and F are replaced with the internal spare memory in the second semiconductor memory M2, and it becomes possible to program the defect address values Q and R of the first semiconductor memory M1. As a result, 6 lines of defect lines A, B, C, D, Q and R of M1 and 2 lines of defect lines E and F of M2 are replaced, respectively, which means that the semiconductor memory system 2 having only 4 lines of spare lines could be made a non-defective unit by one element. Namely, the system can be replaced when the quantity of all the defect lines of the normal memory block 36 is the same as or less than the quantity of all the normal spare lines of the spare memory block 37.

Description has been made above with two chips of the first semiconductor memory M1 and the second semiconductor memory M2 as one group, but a chip activating signal for discriminating among respective chips of a plurality of M2s looking from M1 is required in a system formed of a plurality of chips. For example, it is sufficient to provide two bits of the flag bits 82b in 4 chips and add two terminals to the semiconductor memory system as the logic output, and to provide four bits of flag bits 82b in 16 chips and add 4 terminals thereto in a similar manner. It is sufficient to form the flag bit 82b in this case so that it is stored by a program in advance and activated based on the result of coincidence detection so as to enable to specify the memory of the object in the group, e.g., so as to layout the addresses in the chip. As a result, since it is possible to utilize spare lines of the first semiconductor memory M1 and the second semiconductor memory M2, i.e., semiconductor memory systems of its own and the object mutually by adding the flag bits 82a and 82b to the part of program of the defect address, replacement to the other chips extending over a plurality of memory systems becomes possible.

Besides, although it is aimed at to obtain a perfect non-defective unit of the system in the replacement described above, there is also such a device (such as audio and video media), in which there is no problem as the whole even when a bit defect is in existence partially. In this case, those bits that may include the defect are left in a state of defect bit, so that remaining bits may be replaced completely. Furthermore, when an electrically erasable and writable element such as a flash memory cell is used as a program element, it is possible to realize storage regions 80a and 80b of the defect address and program regions of the flag bits 82a and 82b with an occupied area equivalent to a DRAM cell. In this case, a write control circuit such as high voltage application is provided for a program element, and, in a nonvolatile memory for instance, it may either be controlled by a command instruction system of the semiconductor memory system or written through an external pin directly or a bonding pad provided for the purpose of write high voltage application. Moreover, a pad or the like may also be added for replacement control. Besides, when the unit is utilized only for the replacement of its own like conventional on-chip redundancy, the external terminal 18 is controlled to show "0" for instance by a non-programmed initial state or programming, and the spare memory block and the normal memory block will never be activated and/or deactivated by mistake for itself or the object.

Thus, the present invention can be realized either by separating and assembling memory blocks in a wafer state, i.e., the chips without discrimination between non-defective units and inferior units or by assembling a plurality of memories as one aggregate like wafer scale integration (WSI). On the other hand, in the present invention, the defect addresses stored in the program element of the program/comparison part 16 are written into the nonvolatile memory, but this write operation may be based on the time of production of the memory system, and it is a matter of course that the write operation is possible even the unit is during operation after completion because the operation is electrical erase and write. For the foregoing, it is sufficient that there is addition of a command for replacing the defect address, support by a system software or the like. Therefore, this replacement function is also effective with respect to various replacement such as an eternal hardware error produced in the market, and change-over of a memory cell that has reached the maximum rewrite number of times of the nonvolatile memory.

Figure 4:
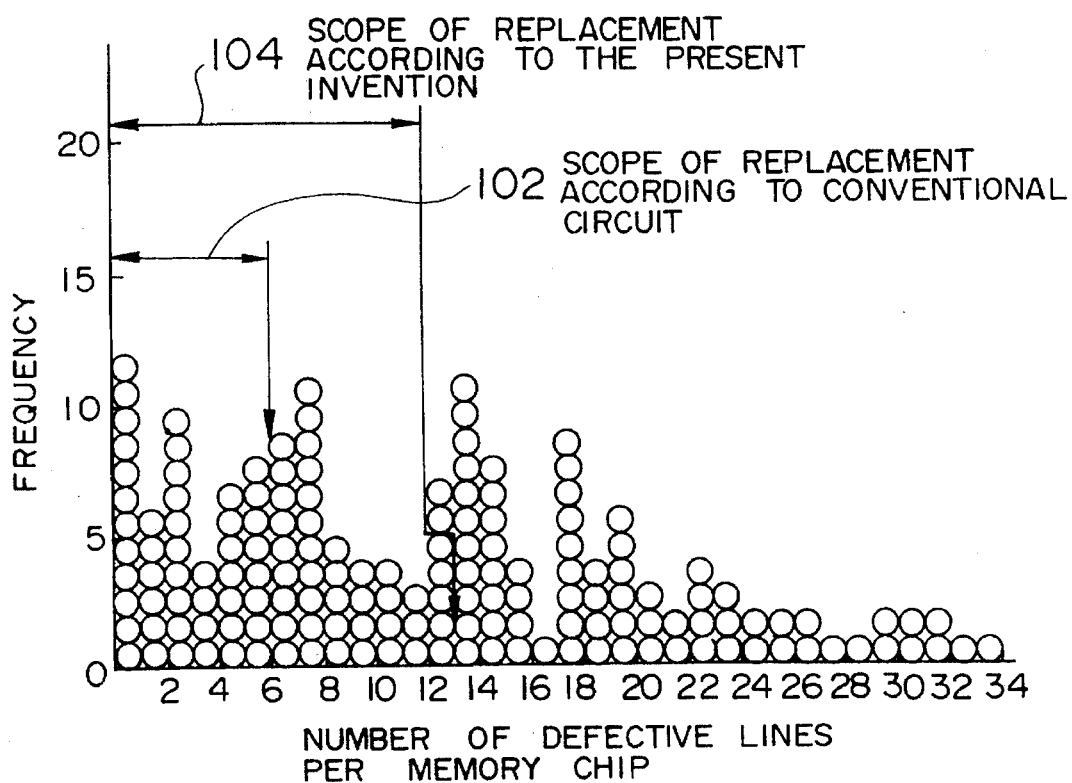
FIG. 4 shows an example of inferiority distribution of semiconductor memory systems for explaining replacement effect in FIG. 1.

FIG. 4 shows an example of inferiority distribution of the semiconductor memory system. FIG. 4 shows evaluated measured values of 1 Mbit SRAM, and the replacement effect of the present invention will be explained by comparing replacement scopes of an on-chip redundant circuit of a conventional semiconductor memory system and a redundant circuit of the semiconductor memory system according to the present invention. The axis of abscissas of FIG. 4 represents the number of defect lines per memory chip of partial non-defective units excluding DC inferiority, the axis of ordinates represents the number of memory chips, 104 represents the scope of replacement according to the present invention, and 102 represents the scope of replacement by a conventional redundant circuit, i.e., an on-chip redundant circuit, respectively.

The SRAM of FIG. 4 has the defect line replacement capacity of the on-chip redundant circuit of 6 lines, and it is conceived that 47 pieces of memory chips become non-defective units by the application thereof. On the other hand, the present invention has a replacement structure, in which spare lines remaining in respective chips are further utilized effectively in those chips showing shortage of the number of redundant lines even when an on-chip redundant circuit is applied as the result of application to 47 pieces of non-defective units as described with reference to FIG. 1. In the present invention, 41 pieces can be made non-defective newly with that structure, and the overall yield becomes approximately twice as high. Further, the number of replaced defect lines per chip reaches approximately 12 lines, which shows increase approximately twice as many as that of the conventional on-chip redundant circuit.

The foregoing shows an example in which the defect origin of the chips is grasped without selecting those chips indiscriminately, but it is sufficient for optimization of the number of replaceable lines including virtual number of lines other than the practical number of spare lines to install a large number of virtual number of replaced lines for instance in order to improve the yield of replacement in indiscriminate, i.e., random selection of chips. Further, it is assumed that selection is made assuming that the maximum number of replaced lines is up to 9 lines, and the other chips when these lines are combined include the number of original defect addresses in 3 lines or less and a margin capable of replacing remaining 3 lines. As a result, since the combination of two chips described above becomes 12 lines or less, they can be replaced without fail. The foregoing shows an example of obtaining non-defective units by combining memories having defects, and it is a matter of course that it does neither limit the number of replaced lines nor limit the number of combined chips in the replacement group.

Figure 5:
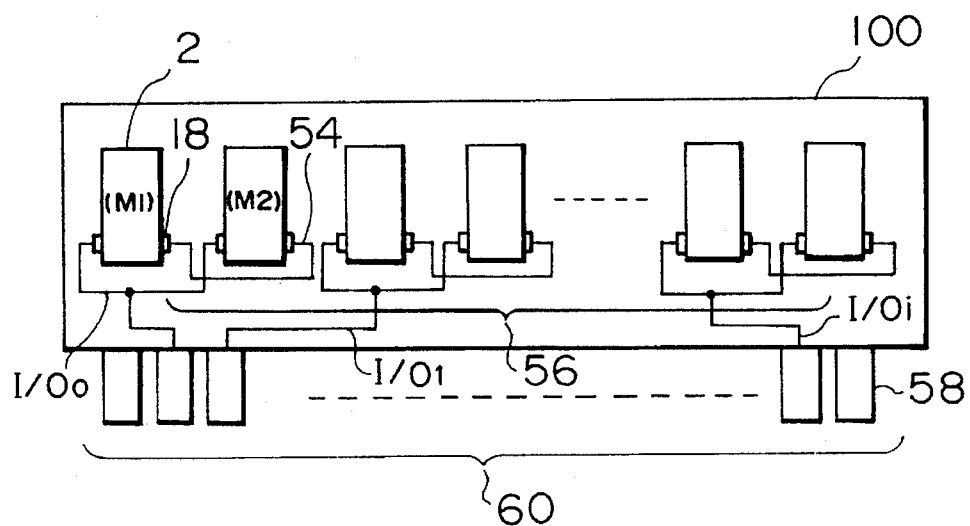
FIG. 5 is a block diagram for explaining a second embodiment of the present invention applied to a memory module.

FIG. 5 shows a second embodiment in which the semiconductor memory system shown in FIG. 1 is used. FIG. 5 shows an example of application to a memory module formed into a memory system added with one line of external terminals to the semiconductor memory system. In FIG. 5, the same reference numbers are assigned to those parts that are the same as those in FIG. 1, and the description thereof is omitted. The structure and the operation of the present invention will be described hereinafter with reference to FIG. 5.

In FIG. 5, a reference numeral 100 represents a memory module, 54 a common spare line connecting between chips of external terminals 18 of memory chips wired in the memory module 100, 56 a memory group that is an aggregate of semiconductor memory units 2, 58 connecting terminals between the memory module 100 and an external unit, I/O0 respective i+1 pieces of I/O signals jointly owned by M1 and M2, and 60 a connecting terminal group for various memory control signals, address signals, I/O signals, power source/ground lines or the like.

Next, the operation of the present embodiment will be described. First, when a chip select signal and an external address are applied, a first semiconductor memory M1 for instance is started, and, when defect addresses coincide with each other with respect to the spare memory space of the second semiconductor memory M2, i.e., in the case of replacement operation, in which there is no spare line in M1, but the spare line is allocated to M2, the external terminal 18 of M1 reaches a high level for instance, and the spare memory block of M2 is activated through the common spare line 54. As a result, information is written in and/or read out of the I/O terminal of the M2 or the I/O0 line. Furthermore, as the power saving operation for bringing two chips into an on-state, the first semiconductor memory M1 is powered-off after activation of the second semiconductor memory M2, and a circuit for inputting and/or outputting information of the spare memory block 37 is at least activated in M2. Besides, in the operation without replacement processed in M1 itself and the replacement operation for making access to the spare memory block 37 of M1, the current consumption is not increased since M2 is a power-off state. Further, control is made so that the output data of M1 and M2 do not collide with each other.

As described above, one external terminal 18 is provided as a bidirectional input/output terminal, namely, added as an external pin of an IC package or a pad for face down bonding for pair chips in the semiconductor memory system, thus making replacement to other chips possible. Besides, the present embodiment shows an example that one group consists of two chips, and the result of coincidence detection itself between the defect address and the external address may be used in place of the flag bit 82b in order to decide upon the object of replacement. In this case, it is sufficient to use the result of coincidence detection regardless of the existence of the flag bits 82a and 82b or even when they are not used. Furthermore, different terminals for input and output may also be used for the bidirectional terminal. Further, it is possible to control the power consumption by operating required circuits only based on the flag bits or the result of coincidence detection described above. Furthermore, as to the current consumption of the first semiconductor memory M1 and the second semiconductor memory M2, the peak current of the memory system may be controlled by controlling both at such a timing that the peak values thereof do not overlap each other.

Figure 6:
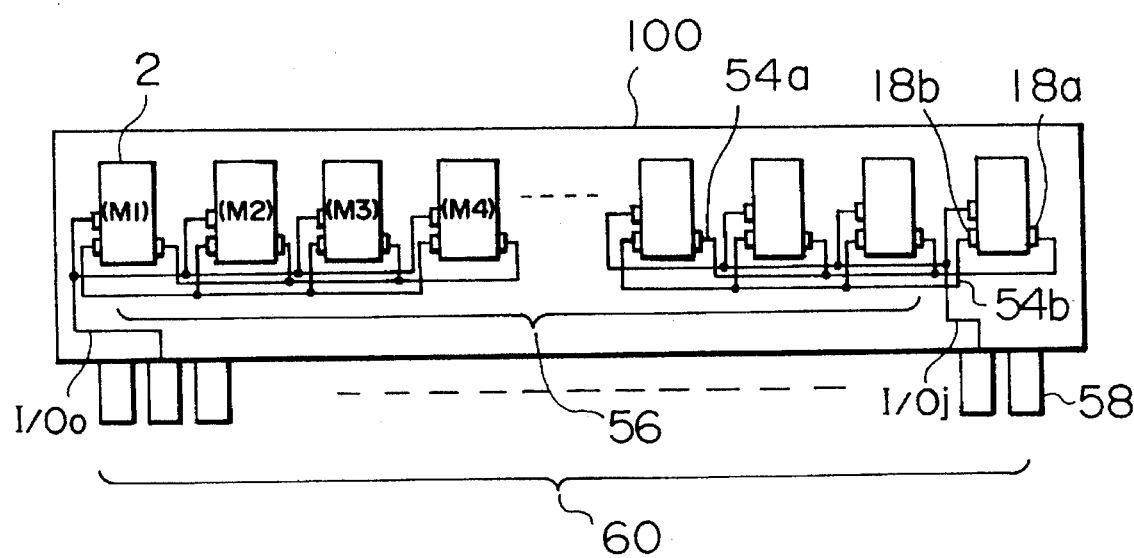
FIG. 6 is a block diagram for explaining a third embodiment of the present invention applied to a memory module.

FIG. 6 shows a third embodiment in which the semiconductor memory system 2 shown in FIG. 1 is used. FIG. 6 shows an example of application of a memory module similar to that shown in FIG. 5. In FIG. 6, the same reference numerals are assigned to those parts that are the same as those in FIG. 5, and the description thereof is omitted. 18a and 18b shown in FIG. 6 represent external terminals, 54a and 54b common spare lines, I/O0 to I/Oj (j+1) pieces of respective I/O signals, and M1 to M4 semiconductor memory systems, respectively.

The structure of the present invention differs from that shown in FIG. 5 in that two terminals of the common spare lines 54a and 54b are added to the semiconductor memory system 2. In the present structure, the flag bit 82b described with reference to FIG. 1 becomes two bits, and the common use of the spare line can be achieved with four chips of M1 to M4. For example, I/O0 that is an I/O signal is made common with respect to M1 to M4. The replacement operation thereof is basically the same as that in FIG. 1, and, first the flag bit 82b in two bits is stored by programming in advance similarly to the defect address in any of the semiconductor memory systems 2 of M2 to M4 that become the objects of replacement. The flag bit 82b is transmitted through the common spare lines 54a and 54b with the first semiconductor memory of M1 on the replaced side at time of replacement, and the second semiconductor memory, one of M2 to M4 that are objects of replacement is specified by decoding the flag bit 82b thereof. As a result, it is possible to increase the number of chips replaceable to other chips in the group to four chips as compared with FIG. 5 by adding two terminals in the memory module, thus improving the yield.

Figure 7:
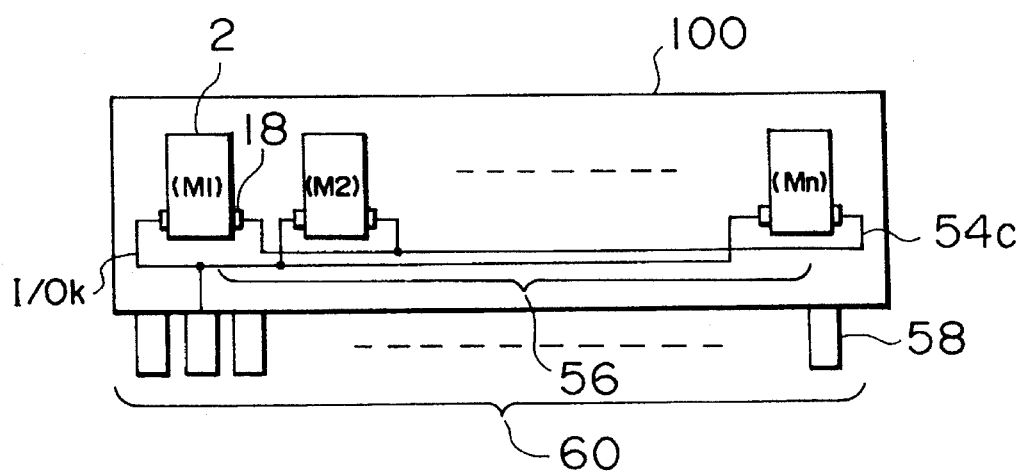
FIG. 7 is a block diagram for explaining a fourth embodiment of the present invention applied to a memory module.

FIG. 7 shows a fourth embodiment in which the semiconductor memory system 2 shown in FIG. 1 is used. FIG. 7 shows an example of application of a memory module similar to that shown in FIG. 5. In FIG. 7, the same reference numerals are assigned to those parts that are the same as those shown in FIG. 5, and the description thereof is omitted. The structure and the operation of the present invention will be described hereinafter with reference to FIG. 7.

In FIG. 7, M1 to Mn represent semiconductor memory systems, 54C represents a common spare line and I/Ok represents an input-output signal of data and is common to M1 to Mn. Different terminals may also be used for the input signal and the output signal. Here, n pieces of memory chips M1 to Mn connect external terminals in common. As a result, as to the defect addresses of n chips, all the defect lines of the present memory module 100 can be replaced within the number of total redundant lines owned by n chips except specific defect lines positioned at the same position in mutual (n−1) pieces of chips in the second semiconductor memory except the first semiconductor memory. On the other hand, it may also be arranged, so that defect positions of individual chips are grasped by testing, and when access is made to respective chips from external chips through the external terminal 18, those chips in which (n−1) pieces of chips do not show specific defect address at the same position are formed into a group, thus constructing the system. Further, each of the semiconductor memory systems may replace specific defect lines at the same position with priority with the spare memory of its own in advance when an on-chip redundant circuit is applied. Furthermore, it may also be arranged so that a chip activating signal of the object of replacement is transmitted by serial transfer to all of the second semiconductor memory M2 from one external terminal of the first semiconductor memory M1, and is decoded and decided upon by the second semiconductor memory M2 which becomes a spare chip side.

Besides, when two pieces of external terminals are provided in the chip as shown in FIG. 6 and all the chips in the module are connected in common to respective terminals, the replacement at a system level by the structure described above can admit existence of 4 lines of specific defect lines at the same position when access is made externally in the memory system and can admit existence of 16 lines of specific defect lines at the same position similarly to the above when four terminals are added in order to realize a non-defective memory system. Accordingly, in the construction of a memory system according to the present invention, it is sufficient to set the number of flag bits taking the final chip combination yield into consideration and add the external terminals to the memory system.

Figure 8:
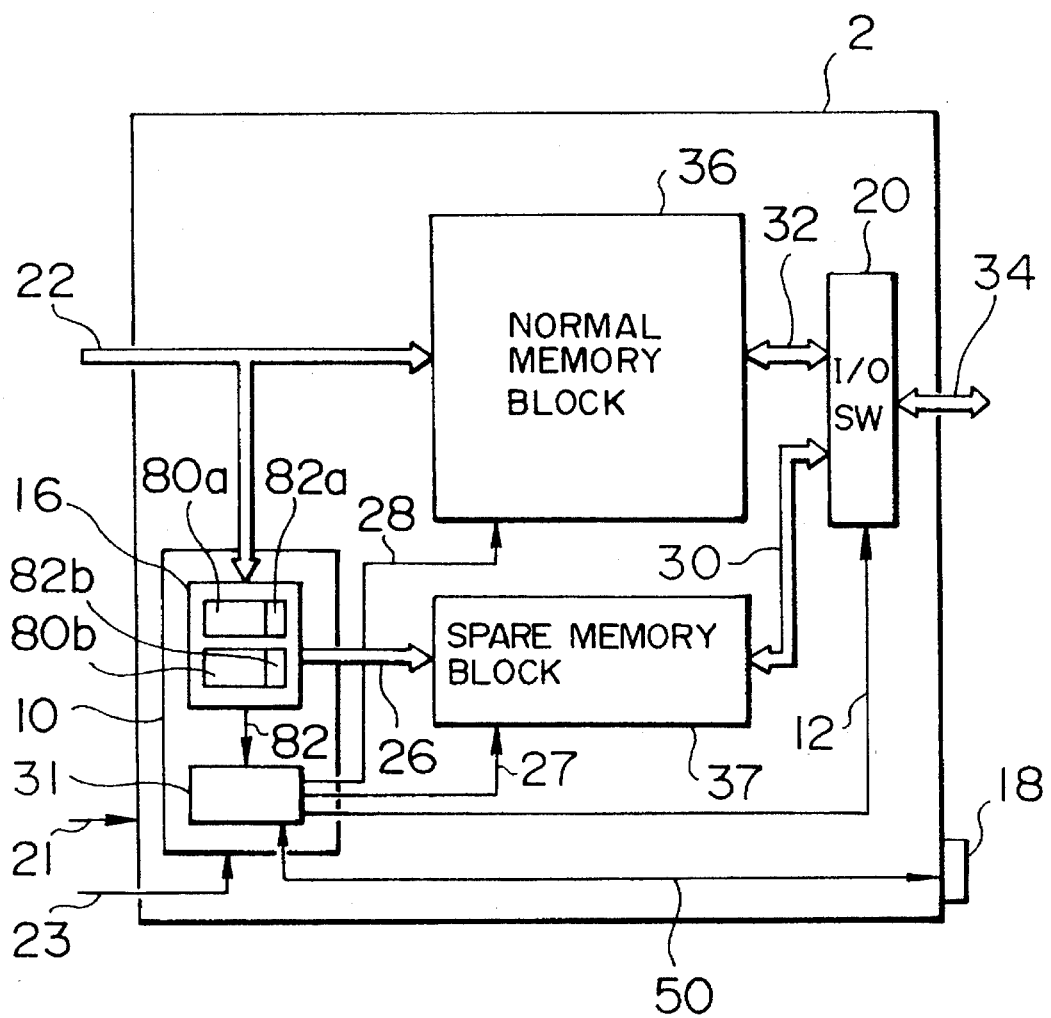
FIG. 8 is a block diagram for explaining a fifth embodiment of the present invention.

FIG. 8 shows a fifth embodiment in which the semiconductor memory system of the present invention shown in FIG. 1 is improved. In FIG. 8, the same reference numerals are assigned to those parts that are the same as those shown in FIG. 1, and the description thereof is omitted. The structure and the operation of the present invention will be described hereinafter with reference to FIG. 8.

In FIG. 8, 32 represents an I/O line of a normal memory block 36, 30 an I/O line of a spare memory block 37, 12 an I/O switching line for switching the I/O line 32 to and from the I/O line 30, and 20 an I/O switching circuit, respectively. Here, FIG. 8 differs from FIG. 1 in that the normal memory block 36 and the spare memory block 37 are separated from each other by means of the I/O switching circuit 20, and the other operations remain the same. The separating operation and the effect thereof will be described hereinafter. Normally, an external I/O line 34 is connected to the normal memory block 36 by the I/O switching line 12, but it is activated based on the result of coincidence detection between the defect address and the external address in a common redundant circuit 10 when the memory block 36 is defective. For example, the external I/O line 34 is switched to the side of the I/O line 30 of the spare memory block 37 when the flag bit 82a shows information "1" in the spare memory space of its own of the first semiconductor memory. Further, when the flag bit 82b shows information "1" in the spare memory space of the object of the first semiconductor memory, the I/O line 34 is switched to the side of the I/O line 30 of the spare memory block 37 of the second semiconductor memory.

As a result of separation of the I/O as described above, load capacities of respective I/O lines of the spare memory block 37 and the normal memory block 36 are reduced. Thus, it is possible to shorten the access time of the spare memory block 37 as compared with FIG. 1 in which the I/O line is common.

Figure 9:
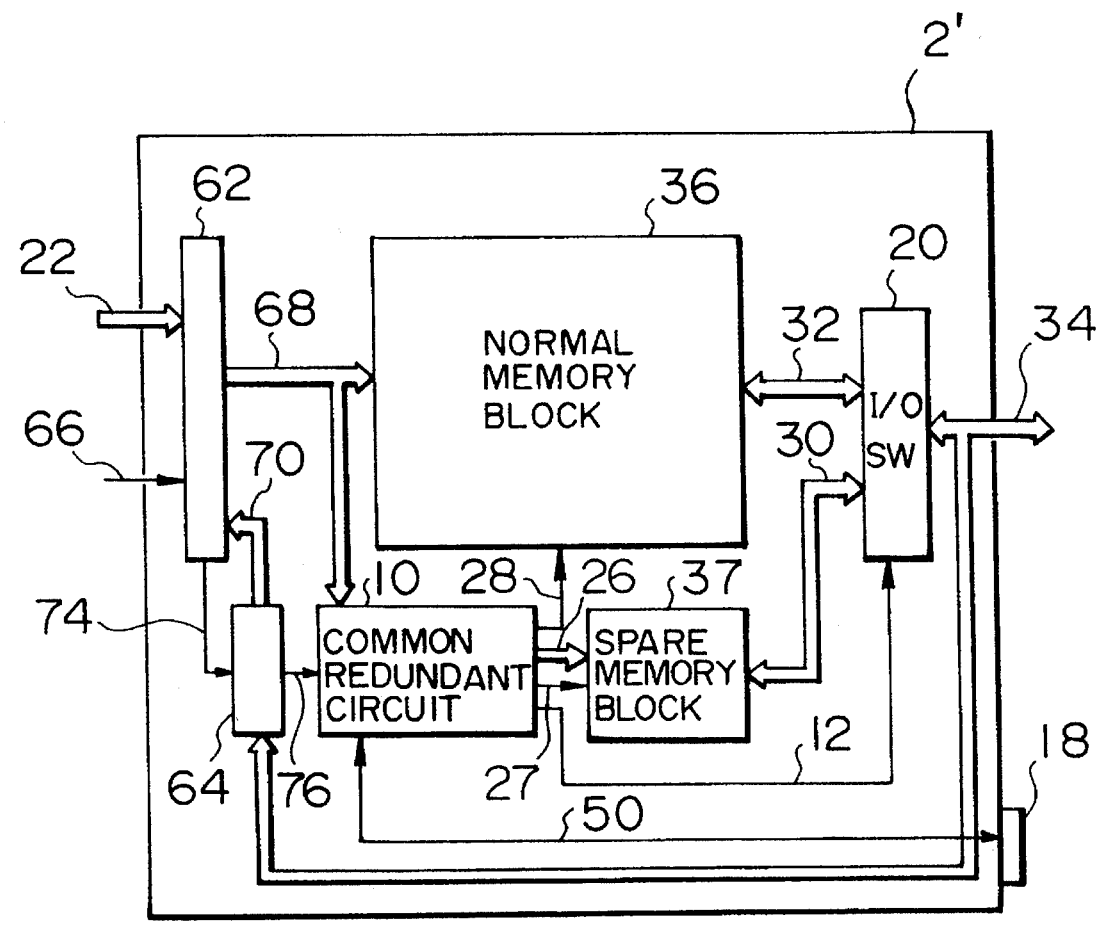
FIG. 9 is a block diagram for explaining a sixth embodiment of the present invention.

FIG. 9 shows a sixth embodiment of the present invention. FIG. 9 shows an example of a semiconductor memory system provided with correct function to self test. In FIG. 9, the same reference numerals are assigned to those parts that are the same as those shown in FIG. 1 or FIG. 8, and the description thereof is omitted. The structure and the operation of the present invention will be described hereinafter with reference to FIG. 9.

In FIG. 9, 2' represents a semiconductor memory system with correct function to self test, 66 an external memory control signal including a chip select signal, 68 an internal address, 64 a correct function to self test circuit having a flow for executing test correction of the semiconductor memory system, 70 an address for test, 74 an activating signal such as test start/stop of the correct function to self test circuit 64, and 76 a test activating signal of the spare memory block 37 and the normal memory block 36, respectively. Furthermore, 62 represents a test control circuit for switching an external address 22 and the address 70 for test in order to detect the defect bit or the defect line of the normal memory block 36 or the spare memory block 37, respectively, and generating various control signals required for write/read control of respective memory blocks based on the external memory control signal 66 inputted to the memory system 2'.

First, the correct function to self test circuit 64 is activated when an instruction to start test correct is given by the external memory control signal 66, thereby to connect the internal address 68 of the normal memory block 36 to the address 70 for test in the test control circuit 62. Further, expected value data generated in the correct to self test circuit 64 are transferred to the normal memory block 36 and loaded in the memory cell through the I/O line 34, the I/O switching circuit 20 and the I/O line 32 by the control of the I/O switching line 12. Thereafter, the data are read and compared with the expected value. This test can be executed while shortening the test time by evaluating the word lines, the bit lines or the like of the memory with respect to one line or a plurality of lines collectively. Further, the defect addresses are stored in the correct to self test circuit 64. On the other hand, the spare memory switches the I/O line 34 to the I/O line 30 of the spare memory block 37 by the I/O switching line 12, and programs the stored defect addresses by the program/comparison part 16 with respect to a spare line that becomes a non-defective unit through evaluation in a similar manner. Besides, a replacement method in which the spare memory block 37 is evaluated whenever the normal memory block 36 shows a defect and defect addresses are programmed in consecutive order may be adopted for the storage of defect addresses. Since the defect address stored in the correct to self test circuit 64 is temporary storage in this case, it is sufficient to include at least one register. Further, since the spare memory block 37 is generally smaller in scale as compared with the normal memory block 36, the test evaluation of the spare memory block 37 may be omitted considering that the yield is almost 100%.

Besides, when the unit is formed into a system, the spare lines of the second semiconductor memory M2 of the object of replacement are utilized in case the spare lines of the first semiconductor memory M1 become short as shown in FIG. 1 and FIG. 5 to FIG. 7. In this case, replacement of the defect inside the chips of the first semiconductor memory M1 itself and the second semiconductor memory M2 itself is executed first of all. Then, it is sufficient to activate the external terminal 18, to activate the spare memory of the second semiconductor memory M2 to the write/read state and evaluate it, and to perform programming of the defect address of M1 and the defect address value for making access to the spare line of M2 in the program/comparison part 16 of respective common redundant circuits 10 of M1 and M2. Besides, although the result of coincidence detection is used sometimes depending on the memory structure, the flag bit is stored together with the defect address value.

As described above, the correct to self test operation is completed first within a scope that individual semiconductor memory system is able to use the independent spare line. Then, replacement of the whole system is made. For example, when an instruction of correct to self test is given externally, individual semiconductor memory systems are activated in consecutive order and defect addresses of respective semiconductor memory systems are allocated to surplus spare lines. Further, in the system replacement, it is also conceivable to control the input of a part of replacement operation such as an address signal, a data signal and a memory control signal from the outside of the system, or to store defect addresses or the like outside.

On the other hand, it is premised on that the replacement operation is executed at time of manufacturing a semiconductor memory system or a memory system using the system, but a structure that correct to self test can be executed on the user side after shipment may also be adopted. Further, the correct to self test circuit 64 may be structured so as to be started after a keyword is inputted for the purpose of preventing correct operation to self test activated by mistake. Furthermore, the correct to self test circuit may be structured so that correct to interrupt test is made in a time-sharing manner for a memory chip that is not during execution of write/read or is even during execution. For example, when a nonvolatile memory is used in a memory system with a semiconductor memory system, it is possible to program defect address information by using long write time thereof and test and evaluate other memory chips in the interim. Further, in a device that the number of rewrite times by erase/write operation is limited such as a nonvolatile memory system, it is possible to improve reliability by replacing defect bits generated at the boundary of the number of rewrite times in consecutive order by using the structure described above. Besides, the replacement operation may also be structured so as to be executed at time of memory check or boot of the system. Furthermore, it is a matter of course that replacement may be executed by individual instruction from the outside of the system regardless of whether the system is not a semiconductor memory system with correct function to self test or that with the function.

In this manner, it is possible to execute replacement operation during operation and to realize shortening of test time and real time replacement in the market according to the present embodiment.

Figure 10:
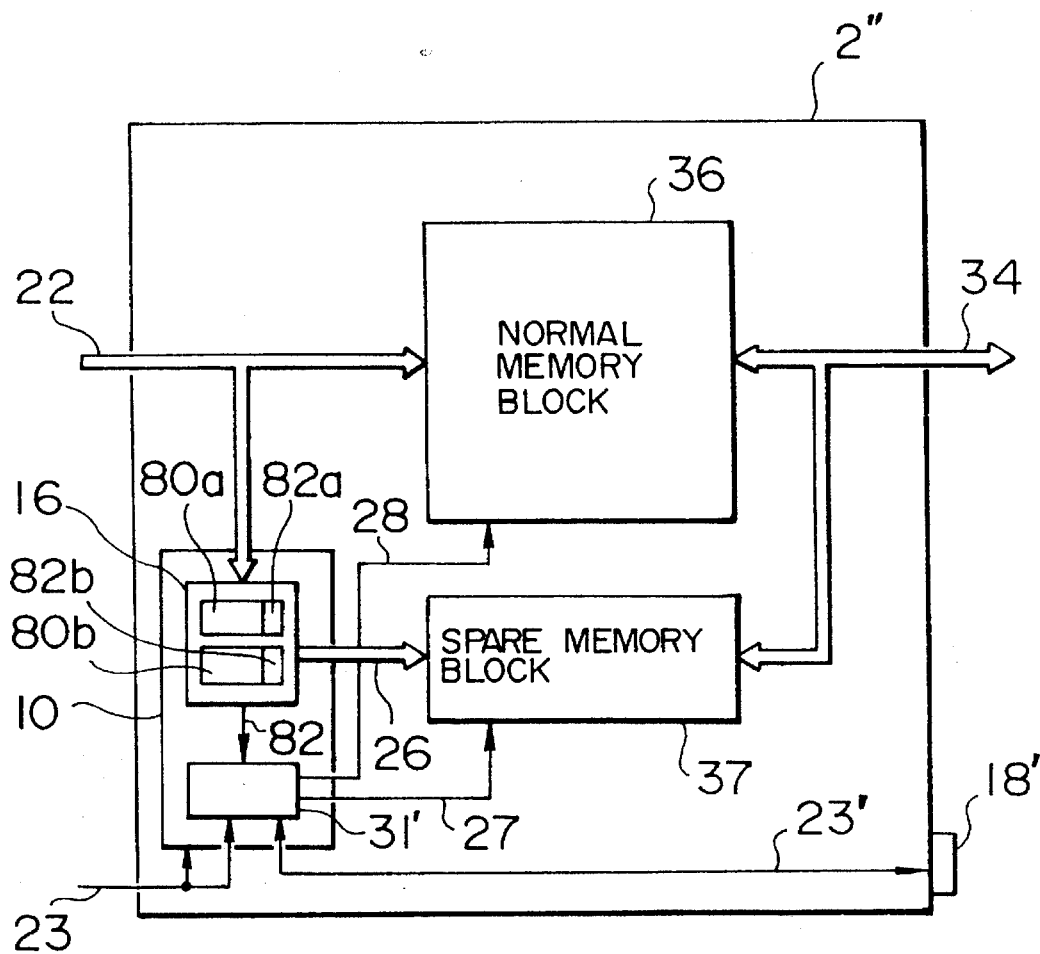
FIG. 10 is a block diagram for explaining a seventh embodiment of the present invention.

FIG. 10 shows a seventh embodiment of the present invention. In FIG. 10, the same reference numerals are assigned to those parts that are the same as those shown in FIG. 1, and the description thereof is omitted. The structure and the operation of the present invention will be described hereinafter with reference to FIG. 10.

A reference numeral 23' shown in FIG. 10 represents an object chip activating signal for activating the second semiconductor memory that becomes the object of replacement of the first semiconductor memory. The object chip activating signal 23' is always activated when the external chip select signal 23 is inputted, and activates the spare memory block 37 of the second semiconductor memory of the object of replacement. Thus, when the external address 22 is inputted, coincidence detection is made by the program/comparison part 16 for the first semiconductor memory and the second semiconductor memory at the same time. As a result, access is made to a specific spare line of the second semiconductor memory when there are defect lines in the first semiconductor memory and the spare lines are short. Since the second semiconductor memory is activated almost simultaneously with the first semiconductor memory in the present embodiment, it is possible to achieve the replacement operation among chips in access time remained unchanged from that of the on-chip redundant circuit. Namely, since no such operation that makes access to the second semiconductor memory is performed from the result of judgement in the program/comparison part 16 of the first semiconductor memory as shown in FIG. 1, read and/or write access is made to the spare memory of the second semiconductor memory with almost no delay.

Furthermore, in the input-output operation of data over the first semiconductor memory and the second semiconductor memory, the flag bit 82a of its own of the first semiconductor memory or the result of coincidence detection deactivates the normal memory block 36 or the spare memory block 37 of its own, and the flag bit 82b or the result of coincidence detection activates the spare memory block 37 of the second semiconductor memory. Thus, it is possible to control the power consumption along with the replacement function described above. Besides, in the case of a plurality of second semiconductor memories that are objects of replacement, it is sufficient that a plurality of external terminals are provided and either the selection of the memory chip of the object of replacement is specified by the object chip activating signal 23' in a plurality of lines or all of the plurality of chips of the object of replacement are activated once and a specific chip only is activated and the others are deactivated by the flag bits 82a stored in respective chips or the information obtained by coincidence detection.

On the other hand, the present embodiment may be applied to the embodiments shown in FIG. 5 to FIG. 7. In such a case, it is sufficient to replace the external terminal 18 shown in FIG. 5 to FIG. 7 with the object chip activating signal 23' and structure the redundancy select circuit 31' of the semiconductor memory system 2 with the chip select signal as an input and the flag bits 82a, 82b or the like from such a viewpoint as shown in FIG. 10. Further, it is a matter of course that the present embodiment is also applicable in the addition of the I/O switching circuit 20 shown in the embodiment of FIG. 8, the addition of correct function to self test shown in FIG. 9 and so on. Besides, the chip select signal 23 is one for activating the memory chip from an external device such as a microcomputer, and the object chip activating signal 23' is one for at least activating the spare memory block produced from the semiconductor memory system.

Since it is possible with the structure described above to utilize the replacement remainder of the object when the spare memory of its own becomes short, improvement of the yield not less than the conventional on-chip redundant circuit structure is expected. Further, the access time is shortened in the spare memory of the second semiconductor memory as compared with the embodiment shown in FIG. 1.

Figure 11:
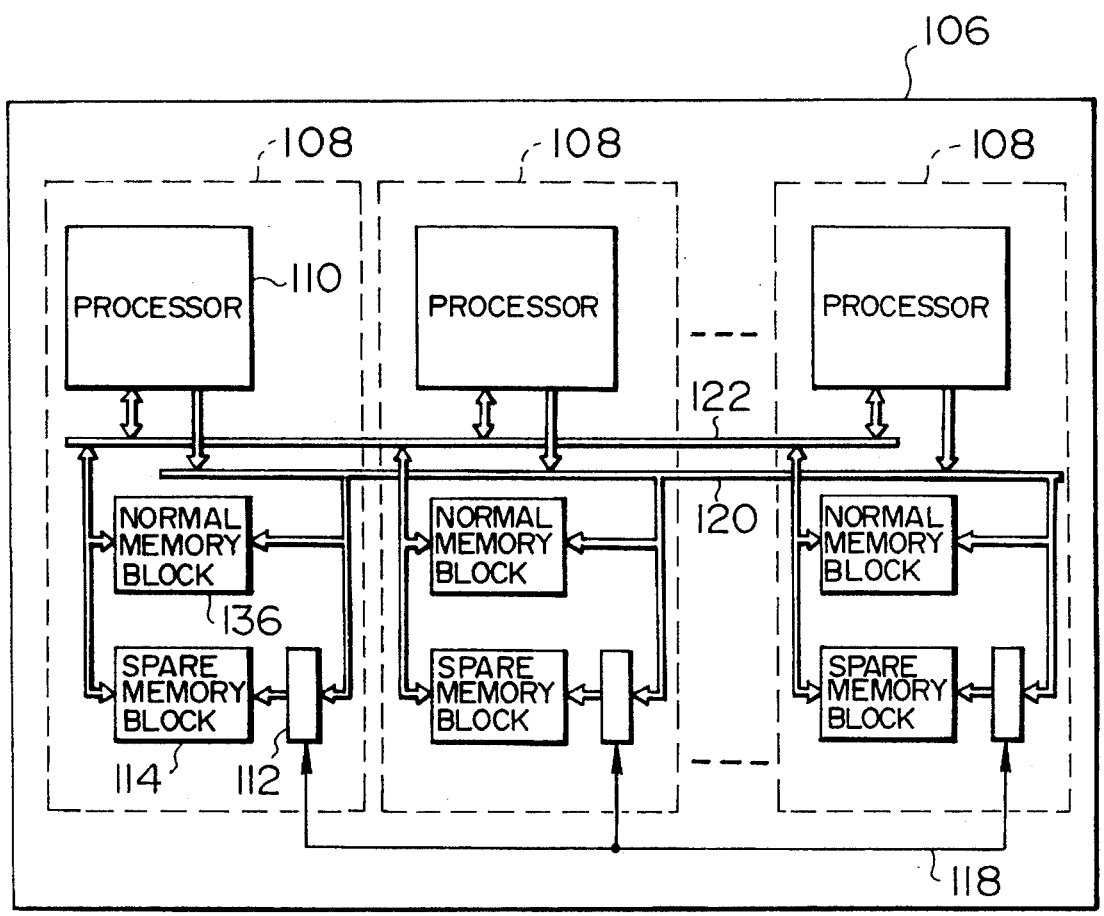
FIG. 11 is a block diagram for explaining an eighth embodiment of the present invention.

FIG. 11 shows an eighth embodiment of a semiconductor memory system contained in a logic of a central processing unit or the like. In FIG. 11, 110 represents a processor, 136 a normal memory block, 112 a common redundant circuit, 114 a spare memory block, 118 a common spare line, 120 an address bus consisting of a plurality of address signals, and 122 a data bus consisting of a plurality of data signals. Further, 108 represents a logic function block composed of a processor 110, a normal memory block 136, a common redundant circuit 112 and a spare memory block 114, and 106 represents a logic in memory formed principally of logic function blocks 108 described above. The normal memory block 136 of the logic function block 108 transmits and receives data to and from the normal memory block 136 of another logic function block 108 through the address bus 120 and the data bus 122. In this case, although it is omitted in FIG. 11, it is a matter of course that a control signal of the memory is required. The operation of the present invention will be described hereinafter with reference to FIG. 11.

When there is a defect in the normal memory block 136 of its own of the logic function block 108 and the number of replacement lines is insufficient with the spare memory block 114 of the logic function block 108, the common spare line 118 is activated to use the spare lines of the spare memory block 114 of another logic function block 108. The defect address value, the flag bit or the like of the common redundant circuit 112 used here are structured with a concept similar to the embodiments that have been heretofore described. With this, the normal memory block 136 of the logic function block 108 becomes capable of mutual replacement among the blocks 108. For example, when the common spare line 118 functions similarly to the object chip activating signal 23' shown in FIG. 10, it is also possible to obtain a high rate access time. Further, all or a required number of spare memory blocks 114 may always be put to an activated state when the logic in memory 106 is in operation. In this case, the operation becomes higher in rate by the time portion when the common spare line 118 of the logic function block 108 of the object shown in FIG. 10 is not generated by the logic function block 108 of its own. The present invention shows an example of application to a multiprocessor formed with a plurality of logic function blocks 108 as the center. This logic function block 108 may be different in logic or memory structure, and is applicable to a logic in memory having a similar memory structure from a viewpoint of the embodiment described above.

In the above embodiment, a redundancy structure when an external terminal is provided in a semiconductor memory system, the terminal is controlled with a flag bit and the replacement object is activated or when the replacement object is activated with a chip select signal has been described. On the other hand, mutual replacement when the external terminal is not provided in the semiconductor memory system, i.e., when no bonding pad is provided, may be made based on the concept of the flag bit of the embodiment described above, as follows. First, when the external address is inputted, the memory chip selected by the chip select signal 23 activates the normal memory block 36 and the spare memory block 37 of the corresponding first semiconductor memory, and also activates the spare memory blocks 37 of the all chips that become the second semiconductor memories. Then, correct spare lines are activated selectively out of the first and the second semiconductor memories activated selectively in accordance with the result of coincidence detection of defect addresses or the value of the flag bit 82a. In this case, the memory system is replaced under such a condition that, assuming that n pieces of chips replaced to other chips form one group, defect lines positioned at the same position are not put one upon another in mutual n pieces of chips. As a result, the defect address 80b of the object of replacement and the flag bit 82b for specifying the object described with reference to FIG. 1 are not required since there is no external terminal. Therefore, it is sufficient to store the defect address of the object at a position that becomes a surplus of the defect address 80a of its own. Further, this is achievable in a conventional on-chip redundant circuit by adding a function of activating all the chip select signals once and making the chip as selected/non-selected based on the result of judgement by coincidence detection of the program/comparison part after the lapse of a certain period. Besides, as to a measure of reducing current consumption generated by a fact that the spare memory blocks of the first semiconductor memory and the second semiconductor memory show an on-state for a certain period of time, it is sufficient to structure so that the common redundant circuit 10 on the side of the second semiconductor memory does not consume current other than the period for activation and judgement. Furthermore, it is sufficient to bring all but the selected normal memory blocks or spare memory blocks into an off-state after activation and judgement.

On the other hand, according to a semiconductor memory system of the present invention, it is sufficient, in a system with a plurality of semiconductor memory systems, to form the first semiconductor memory of one chip and the second semiconductor memory of at least one chip that becomes an object of replacement in one group, and to prepare a plurality of flag bits 82b in advance in the program/comparison part 16 in order to realize mutual replacement thereof. Since all of these flag bits 82b may either be used or not used, it is sufficient to use them by selecting the number of bits appropriately in accordance with various bit configurations. Surplus bits in that case may be structured so that no influence is exerted upon replacement. Besides, even when those groups that are different due to the number of chips to be replaced mutually, semiconductor memory systems having different number of external terminals for replacement, memory structures and so forth are included in one system, the replacement operation is executed closely in at least one group. Hence, the embodiments of the present invention are applicable without any problem.

Further, according to the present invention, each of the first semiconductor memory and the second semiconductor memory function on the replacement side and on the replaced side, and both store the defect addresses and flag bits of at least the semiconductor memory systems having defects except the redundant structure having no external terminal. Therefore, increase of the occupied area by the program/comparison part 16 is conceivable. However, the demerit in point of the area is small as compared with approximately doubled effect of improvement of the yield of replacement as shown in FIG. 3. Furthermore, in a nonvolatile semiconductor memory system, the memory cell may be utilized as a program element since the memory cell thereof has a cell area equivalent to that of a DRAM cell. In this case, it is possible to reduce the area of the program region as compared with a conventional method of fusing polysilicon or the like by laser light or electricity. In this case, a bonding pad or the like for high voltage application or control for loading a nonvolatile memory cell may be provided for controlling the semiconductor memory system. Further, write of the program element with the memory cell may also be controlled by utilizing the memory control signal of the semiconductor memory system, the external address signal, the I/O signal or the like. In particular, since the semiconductor memory system composed of nonvolatile memory cells can be executed without any change of process, it is suitable for the semiconductor memory system of the present invention.

On the other hand, the replacement operation in the system can be performed after defects of the semiconductor memory system of its own are replaced or in a state before replacement. Namely, this becomes easy by using the electrically writable memory cell described above for the program element. Further, the write operation can also be performed in a separated single chip state before incorporating into the system. In this case, it is sufficient to know defect origin of its own and the object of each replacement group formed into a system. The system configuration in that case makes it a condition that the total number of defect lines is equal to or smaller than the total number of spare lines except the generation of defects due to assembly. Besides, when the external terminal is not used, the semiconductor memory system is similar to a conventional semiconductor memory system with an on-chip redundant circuit. For example, when the external terminal is not used for replacement of the external spare memory block, it is sufficient to fix the external terminal at ground or power source voltage, a low level or a high level, or by the logic of the internal circuit of the chip using the program element. Therefore, no influence is exerted on the memory chip of its own or the object by adding the terminal.

Besides, the present invention is not limited to the embodiments described above. For example, external appearance and configuration of the system, memory structure, method of programming may be modified in various manners as occasion demands. Further, even when the structures of the first and the second semiconductor memories are different from each other, replacement is possible for those that have the unit of replacement (such as a word line, a bit line or a sector, and a memory block) in the same size and have similar replacement functions. It is sufficient to alter the flag bit in the common redundant circuit in the structure, a logic level of the redundancy select circuit, or the bit size of the program/comparison part and so forth in accordance with circumstances. Furthermore, write steps of procedures of the defect addresses and flag bits can also be altered, and all or a part thereof may be controlled from the outside of the system. In that case, control is made easier by outputting the information to the effect that write is during execution to the external device of the system. Further, programming of defect addresses and flag bits can also be made by laser light, short-circuit by electricity or an open type program element. In this case, it is recommended to manage and grasp the chip defect status in groups replaced mutually in advance before incorporating them into the system, i.e., before packaging, thereby to perform programming. On the other hand, respective steps of replacement operation described in the above-mentioned embodiments may be incorporated in the operation mode select function of the semiconductor memory system and selected in various manners.

Furthermore, mutual replacement in a system that the input-output bit structure of the semiconductor memory system includes multi-bits has been described in the foregoing, but the concept of the present invention is also applicable to a memory system in that the input-output bit is of one bit structure or the input-output terminals are separated, and does not limit the input-output bit structure. Further, it is a matter of course that the concept of the present invention is also applicable similarly to nonvolatile memories such as a ROM, an EPROM, an EEPROM and a batch erase type flash memory composed of MOS transistors, bipolar transistors or a composite device thereof, memories such as a DRAM and an SRAM, a multi-port type memory, a memory having spare bits for another parity bit and error correct code, and a composite memory including these memories.

On the other hand, the embodiments have shown replacement with word line defects or bit line defects of the normal memory blocks of a semiconductor nonvolatile memory system for instance as the unit. When the information is controlled in sector unit (256 bytes, 512 bytes, . . . ), however, the structure may be formed so that word line defects or bit line defects are controlled with respect to a plurality of lines collectively or dividing them in a form corresponding thereto, and insufficient spare memories of the memory chip of its own are supplemented with the memory chips of the object of replacement. Besides, it is a matter of course that it is possible to control the information in block (4 Kbytes, 8 Kbytes, . . . ) unit in that a plurality of sectors are collected in replacement.

On the other hand, when there are a plurality of normal memory blocks and spare memory blocks in one chip and write/read are possible in and out of these memory blocks as individual memory blocks, the present invention is applicable in a similar manner.

It is a matter of course that the present invention can also be utilized for semiconductor memory systems such as a memory system chip made to have a large capacity, a memory containing a microcomputer, a logic in memory including a gate array, a wafer scale integration constructed on a wafer. Namely, it is possible to execute the present invention with various modifications without departing from a scope of the substance thereof.

According to the present invention, it is possible to improve the yield by a large margin by adding a flag bit for judging the spare memory of its own or the object of replacement, a redundancy select circuit and an external terminal to a redundant circuit of a semiconductor memory system, respectively. Further, since the flag bit selects the object of replacement and also operates as a power saving function, there is an effect of controlling the increase of current consumption. Furthermore, when the system is structured so as to generate a chip activating signal of the semiconductor memory system of the object of replacement with an external chip select signal of the semiconductor memory system of its own, it is possible to make the access time of the spare memory at time of mutual replacement higher in rate.

Besides, when the present invention is formed of devices of inexpensive unit cost that does not require a power source for holding information such as a nonvolatile semiconductor memory system, memory chips that have been abandoned as defects can be utilized. Therefore, a memory system having a large capacity can be realized at a low cost. Further, since defects can be corrected electrically in the market or during system operation, defect bits generated due to limitation of the number of rewrite times of the nonvolatile memories can be replaced one after another. As a result, the number of rewrite times is increased and the reliability of the semiconductor memory system is improved.

What is claimed is:

1. A semiconductor memory system comprising:
   a normal memory block including a normal memory storing information and a normal decoder selecting a memory cell in said normal memory;
   a spare memory block including a spare memory being used for replacement of said normal memory and a spare decoder selecting a memory cell in said spare memory; and
   a program/comparison part having a part for storing a defect address of said semiconductor memory system and a part for storing a defect address of another semiconductor memory system;
   wherein said program/comparison part compares at least one of the stored defect address of said semiconductor memory system and the stored defect address of said another semiconductor memory system with an address applied to said semiconductor memory system, and activating said spare decoder when said applied address coincides with said defect address of said another semiconductor memory system.

2. A semiconductor memory system comprising:
   a plurality of normal memory blocks each including a normal memory storing information and a normal decoder selecting a memory cell in said normal memory;
   a plurality of spare memory blocks, each spare memory block including a spare memory being used for replacement of said normal memory and a spare decoder selecting a memory cell in said spare memory; and
   a plurality of program/comparison parts, each program/comparison part having a part for storing a defect address of said semiconductor memory system and a part for storing a defect address of another semiconductor memory system;
   wherein each program/comparison part compares at least one of the stored defect address of said semiconductor memory system and the stored defect address of said another semiconductor memory system with an address applied to said semiconductor memory system, and activating said spare decoder when said applied address coincides with said defect address of said another semiconductor memory system.

3. A semiconductor memory system comprising:
   a first semiconductor memory chip and a second semiconductor memory chip;
   wherein said first semiconductor memory chip comprises:
   a normal memory block including a normal memory storing information and a normal decoder selecting a predetermined memory cell;
   a spare memory block including a spare memory being used for replacement of said normal memory and a spare decoder selecting a memory cell in said spare memory; and
   a program/comparison part having a part for storing a defect address of said first semiconductor memory chip for replacing a defect of said first semiconductor memory chip with said spare memory and a part for storing a defect address of said second semiconductor memory chip for replacing a defect of said second semiconductor memory chip with said spare memory of said first semiconductor memory chip;
   wherein said program/comparison part compares at least one of said stored defect address of said first semiconductor memory chip and said stored defect address of said second semiconductor memory chip with an address signal applied to said semiconductor memory system, and activating said spare decoder when said applied address signal coincides with said defect address of said second semiconductor memory chip.

4. A semiconductor memory system according to claim 3, further comprising a common redundant circuit in said first semiconductor memory chip for allocating, when a defect bit of said first semiconductor memory chip cannot be replaced by itself, the defect bit to said second semiconductor memory chip.

5. A semiconductor memory system according to claim 4, wherein each of the first semiconductor memory chip and the second semiconductor memory chip is selected by said common redundant circuit based on the result of coincidence comparison between the defect address of at least one of the first semiconductor memory chip and the second semiconductor memory chip stored in the program/comparison part of said common redundant circuit and the address signal applied to said memory system.

6. A semiconductor memory system according to claim 4, wherein each of the first semiconductor memory chip and the second semiconductor memory chip is selected in accordance with flag information including at least one bit, wherein said flag information is added to the defect address stored in the program/comparison part of said common redundant circuit.

7. A semiconductor memory system according to claim 5, wherein a main memory block of the first semiconductor memory chip, a spare memory block of the first semiconductor memory chip and a spare memory block of the second semiconductor memory chip are activated or deactivated in accordance with said flag information stored in said program/comparison part of said common redundant circuit.

8. A semiconductor memory system according to claim 6, wherein a main memory block of the first semiconductor memory chip, a spare memory block of the first semiconductor memory chip and a spare memory block of the second semiconductor memory chip are activated or deactivated in accordance with said flag information stored in said program/comparison part of said common redundant circuit.

9. A semiconductor memory system according to claim 5, further comprising at least one external terminal connected to a redundancy select circuit in said common redundant circuit.

10. A semiconductor memory system according to claim 6, further comprising at least one external terminal connected to a redundancy select circuit in said common redundant circuit.

11. A semiconductor memory system according to claim 9, wherein said external terminal is a pad for bonding.

12. A semiconductor memory system according to claim 9, wherein a spare memory block of said semiconductor memory system is activated or deactivated in accordance with an input/output logic level of a common internal spare line connecting said redundancy select circuit and the external terminal to each other.

13. A semiconductor memory system according to claim 9, wherein a spare memory block of the second semiconductor memory chip is activated when a defect address of said first semiconductor memory chip stored in the program/comparison part coincides with an address applied to said memory system and a logic level of a common internal spare line through an external terminal is activated.

14. A semiconductor memory system according to claim 7, wherein, when said flag information activating a spare line of the second semiconductor memory chip in the redundancy select circuit of the first semiconductor memory chip indicates a predetermined value in response to an address input to said first semiconductor memory, the second semiconductor memory chip receives the flag information, and access the spare line of the second semiconductor memory in response to an activation of said second semiconductor memory based on a result of a comparison between said inputted address and said stored address in the second semiconductor memory.

15. A semiconductor memory system according to claim 13, wherein, when a signal at a predetermined value for activating a spare line is inputted from the first semiconductor memory chip which is capable of being replaced by the second semiconductor memory chip, a spare memory block of the second semiconductor memory chip is activated, and a normal memory block and a spare memory block of the first semiconductor memory chip are deactivated.

16. A semiconductor memory system according to claim 15, wherein a signal activating a spare line of a spare memory block of the second semiconductor memory chip is generated by the first semiconductor memory chip based on a chip select signal of the first semiconductor memory chip.

17. A semiconductor memory system according to claim 3, wherein common redundant circuits of said first semiconductor memory chip and said second semiconductor memory chip are activated at the same time, and the first semiconductor memory chip or the second semiconductor memory chip is selected based on the result of coincidence comparison between defect addresses programmed in the program/comparison parts of said common redundant circuits of both and the external input address and the flag information.

18. A semiconductor memory system according to claim 17, wherein the signal for activating the first semiconductor memory chip and the second semiconductor memory chip is a chip select signal.

19. A semiconductor memory system according to claim 1, wherein the program element for storing a defect address and a flag bit used in said program/comparison part is an electrically erasable and writable nonvolatile memory cell.

20. A semiconductor memory system according to claim 3, wherein the program element for storing a defect address and a flag bit used in said program/comparison part is an electrically erasable and writable nonvolatile memory cell.

21. A semiconductor memory system according to claim 19, wherein said program element is a flash type memory cell capable of batch erasing of a plurality of stored data.

22. A semiconductor memory system according to claim 1, wherein said semiconductor memory is a memory having a function of testing and recovering a memory cell by itself, and has a correct function to self test circuit for executing defect replacement of a predetermined semiconductor memory based on the result of the test.

23. A semiconductor memory system according to claim 3, wherein said semiconductor memory is a memory having a function of testing and recovering a memory cell by itself, and has a correct function to self test circuit for executing defect replacement of a predetermined semiconductor memory based on the result of the test.

24. A semiconductor memory system according to claim 22, wherein a plurality of semiconductor memory chips are arranged in the semiconductor memory system, wherein each of said plurality of semiconductor memory chips includes a correct function to self test circuit for making replacement among memory chips having a function of correcting memories of at least a first semiconductor memory chip by self test, activating a spare memory block of a second semiconductor memory chip for said first semiconductor memory chip thereafter, and allocating spare lines insufficient for the replacement of respective first semiconductor memory chip to the spare memory blocks of the second semiconductor memory chip successively.

25. A semiconductor memory system according to claim 24, wherein said semiconductor memory system has at least one function of testing memory cells of respective semiconductor memories and restoring defects.

26. A semiconductor memory system according to claim 25, wherein said semiconductor memory system, after setting up the memory system, stores data of defect addresses and flag information of the first semiconductor memory chip and also outputs the data from an I/O terminal of the system, and writes the defect addresses and flag information of the same data in the second semiconductor memory chip corresponding to mutual replacement of the first memory chip based on said defect address and said flag information.

27. A semiconductor memory system according to claim 9, wherein one of said external terminals and a corresponding external terminal of a semiconductor memory to be replaced are connected to each other so as to mutually replace defect address.

28. A semiconductor memory system according to claim 1, wherein input terminals, output terminals or input-output terminals of said semiconductor memory system and similar terminals of said another semiconductor memory system to be replaced are connected to each other.

29. A semiconductor memory system according to claim 3, wherein input terminals, output terminals or input-output terminals of said first semiconductor memory chip and similar terminals of said second semiconductor memory chip to be replaced are connected to each other.

30. A semiconductor memory system according to claim 9, wherein said external terminals for mutual replacement of defect addresses have a normal terminal of said semiconductor memory in common.

* * * * *

UNITED STATES PATENT AND TRADEMARK OFFICE
CERTIFICATE OF CORRECTION

PATENT NO. : 5,469,390
DATED : November 21, 1995
INVENTOR(S) : Toshio Sasaki, et. al.

It is certified that error appears in the above-indentified patent and that said Letters Patent is hereby corrected as shown below:

Column 8, line 6, after "I/00" insert --to I/0i--.

Signed and Sealed this

Twelfth Day of March, 1996

*Attest:*

BRUCE LEHMAN

*Attesting Officer*    Commissioner of Patents and Trademarks